Dec. 20, 1966 J. O. McCALDIN 3,293,084

METHOD OF TREATING SEMICONDUCTOR BODIES BY ION BOMBARDMENT

Filed Sept. 9, 1963

*INVENTOR.*
JAMES O. McCALDIN
*BY*
A. Fredrick Lamann
ATTORNEY

United States Patent Office 3,293,084

Patented Dec. 20, 1966

3,293,084

METHOD OF TREATING SEMICONDUCTOR BODIES BY ION BOMBARDMENT

James O. McCaldin, Los Angeles, Calif., assignor to North American Aviation, Inc.

Filed Sept. 9, 1963, Ser. No. 308,617
20 Claims. (Cl. 148—1.5)

This application is a continuation in part of my application Ser. No. 252,518, now being abandoned, filed January 18, 1963.

This invention relates to a process for manufacturing semiconductor devices and to devices fabricated in accordance with this process.

One aspect of the present invention relates to the treatment of a body of semiconductor material to alter or control the properties thereof in a manner which provides an advantageous distribution of conductivity-type determining impurities in such a body.

Conductivity-type-determining impurities may be introduced substitutionally or interstitially into the lattice of a semiconductor body. The use of substitutional type impurities for achieving specified electrical properties requires heating to high temperatures in order to produce the desired distribution within the material. This requirement substantially increases manufacturing difficulties and usually results in degrading the performance characteristics of the semiconductor. Conductivity-type-determining impurities which exhibit characteristics usually associated with an interstitial dopant, notably lithium, have required elaborate processing steps and have restricted the uses to which resulting devices could be put, because of the high diffusivity of lithium.

In accordance with the broad aspects of this invention a semiconductor, whether intrinsic or of a given conductivity type, is treated at a temperature sufficient to promote repair of damaged lattice structure while at the same time the heated semiconductor is bombarded with ions imparting a predetermined conductiviy type to the semiconductor to control the semiconductor conductivity. Thereby, conductivity may be imparted to an intrinsic semiconductor or existing conductivity may be enhanced or altered.

In accordance with certain aspects of this invention, the semiconductor body of one conductivity type, heated to a temperature sufficient to promote repair of damaged lattice structure, is bombarded with ions imparting opposite conductivity-type in the body. The body is bombarded for a time sufficient to provide a concentration of secondary impurities sufficient to control and determine the conductivity type of at least a portion of the semiconductor body. A particularly preferred feature of this invention giving superior results is the bombardment of heated p-type silicon by donor type alkali metal ions selected from the group consisting of sodium, potassium, rubidium and cesium. In another aspect, n-type silicon may be bombarded with these alkali metal ions to enhance the n-type silicon to n plus conductivity. In still another aspect, intrinsic semiconductor material may be made to have n-type conductivity by suitably bombarding this material with these donor-type alkali metal ions.

In the present invention conductivity-type-determining impurities are divided into two categories. The primary acceptor impurities for imparting p-type conductivity to a semiconductor are those of Group III, such as boron, aluminum, gallium and indium; the primary donor impurities for imparting n-type conductivity are those of Group V of the periodic table of elements, such as phosphrous, aresenic and antimony. The secondary impurities of this invention are the alkali metals of Group I beginning with sodium, i.e., sodium, potassium, rubidium and cesium, but excluding lithium which exhibits diffusion characteristics significantly different from the secondary impurities of the present invention. The present invention is based to a considerable extent on the discovery of certain novel principles affecting intersitial-type doping and the correlation of these novel principles in the fabrication of semiconductor devices. An example is the substantial reduction of diffusion of secondary impurities compared to lithium which has been considered unsuitable for use in semiconductor devices because of its high diffusivity.

It is known that elements of Group IV of the periodic table of elements may be made semiconducting of a particular characteristic conductivity-type by introducing acceptor elements from Group III or donor elements from Group V, and that semiconductor compounds of the Group III–V type may be made. The processes for accomplishing this as well as the resulting semiconductors are well-known in the art.

In accordance with the principal object of the present invention, controlled as well as altered electrical characteristics of a semiconductor body may be affected by bombarding the body with ions of certain secondary conductivity-type-determining elements.

Another object of the present invention is to provide a method for selectively altering the electrical characteristics of all or any portion of semiconductor in a controlled and predetermined manner.

A further object of the present invention is to provide a method for producing signal translating devices, wherein the product resulting from the method exhibits advantageous electrical and operating characteristics.

These and other objects and advantages of the present invention will be more apparent from the following detailed description, together with the appended drawings, made a part hereof, in which.

Figure 1:
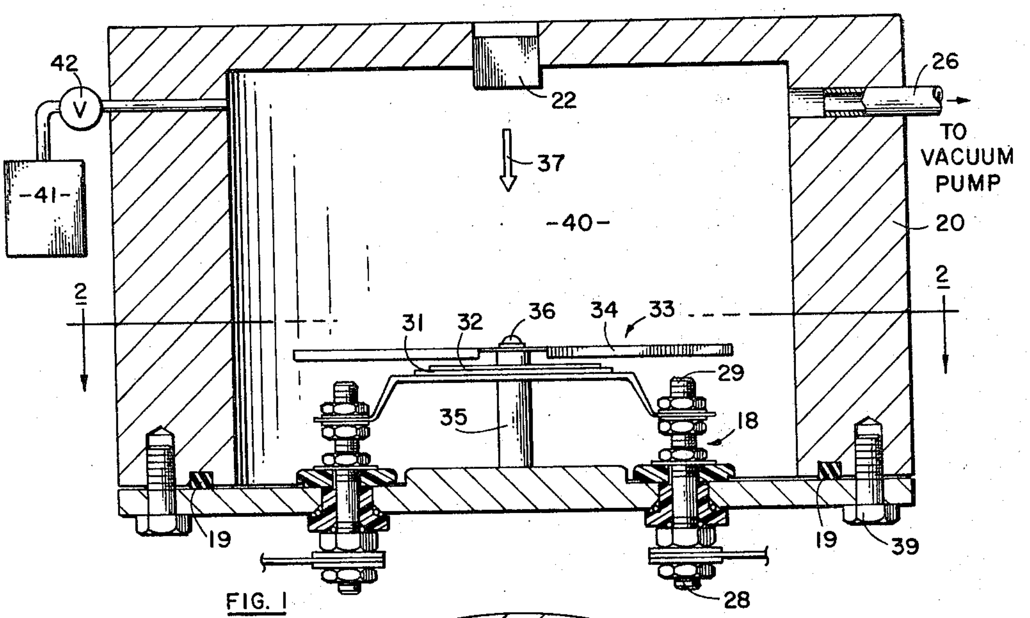
FIG. 1 is a sectional view of the apparatus for carrying out the method of the present invention.

FIGS. 3*a* and *b* are sectional representations of a semiconductor body having electrical characteristics altered by the method of the present invention; and FIGS. 4*a* and *b* are graphs showing the distribution of primary and secondary impurities in the respective bodies of FIGS. 3*a* and *b*.

One aspect of the present invention is directed to introducing secondary conductivity-type-determining impurities into semiconductor bodies or semiconductors which have been doped by any known method with primary conductivity-type-determining impurities. The introduction of these secondary impurities results in a semiconductor having characteristics of interstitial-type doped bodies within predetermined volumes and layers within and on a semiconductive body.

It has been discovered that when a body of high purity silicon doped with a primary impurity is bombarded with ions of a secondary conductivity-type-determining impurity, marked changes in the properties thereof or in the properties of preselected layers, stratums or discrete portions thereof result.

The use of interstitial impurities, in accordance with the teachings hereof, offers distinct advantages over the use of substitutional impurities. When a semiconductor is bombarded by ions of a substitutional donor such as phosphorus, the phosphorus atoms are probably lodged at first in interstitial positions. In these positions they do not possess their usual donor properties and are therefore not true conductivity-type-determining impurities available in the usual manner for device purposes. The situation is improved by annealing the bombarded specimen at an elevated temperature so that vacancies are made available to the initially interstitially located potential donors and they may assume substitutional positions. Only when such potential donors are in the substitutional state are they able to actually function as donors. However, the annealing at elevated temperature permits the potential donor to undergo appreciable diffusion so that the original distribution is no longer clearly defined. In fact, the lack of clarity of distribution ultimately realized by such a process is essentially the same as would be obtained had diffusion techniques rather than bombardment techniques been used in the first place. Thus, prior art bombardment methods requiring subsequent annealing have little or no advantage over conventional techniques.

In the case of the interstitial donors of the present invention, however, the impurity is prepared to function as a donor from its interstitial position achieved initially during the bombardment. No subsequent annealing step is required. The annealing of bombardment damage is achieved during the bombardment itself by holding the specimen at an elevated temperature. The elimination of the post-bombardment annealing step makes it possible to preserve the initially sharp donor distribution. This represents a distinct advantage over the case of substitutional donors.

The secondary impurities injected by the ion bombardment techniques described herein are considered to occupy interstitial positions in the semiconductor, since certain tests performed on bombarded samples provided results consistent only with interstitial doping characteristics.

The bombardment of a p-type semiconductor with donor ions of the secondary-type may produce a p-n junction, the location of which, in the p-type body bombarded, is well defined and the penetration depth of which is dependent upon the ion energy.

The p-n junction near the surface can function as a rectifier in the manner characteristic of all p-n junctions. In the forward direction with positive voltage applied to the p-region majority carriers can flow from their respective side across the junction so that easy flow takes place. This is the forward direction of the rectifier. With positive potential applied to the n-region only minority carriers can cross the junction, and this is the direction of hard flow or reverse direction of the rectifier. The n-region near the surface shows a substantially uniform but altered resistivity. In particular, an untreated highly polished semiconductor surface shows a higher resistivity than a surface treated in accordance with the present invention.

The concentrations of the secondary impurity in such semiconductive devices may be varied dependent upon the length of time of bombardment. The body is preferably bombarded for a time sufficient to generate a layer, stratum or volume having a concentration of secondary impurities sufficient so that the electrical properties of the layer or volume is determined by the secondary conductivity-type-determining impurity. In most instances this concentration will exceed the equilibrium concentration of the ion element in the semiconductor bombarded.

In doped semiconductors, such as silicon heavily doped with boron, the concentration of the secondary impurities must equal or exceed the concentration of the primary impurity in order for the secondary impurity to completely control the conductivity type.

Figures 2, 3, 4:
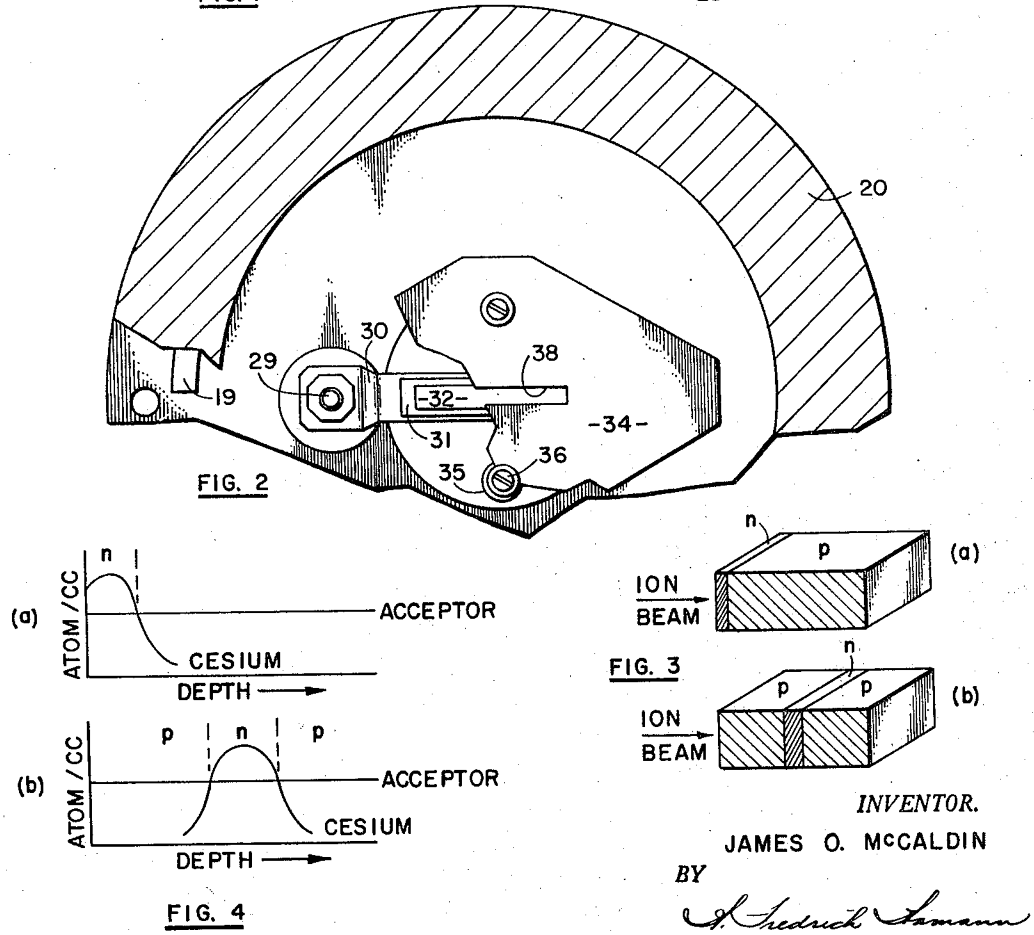
FIG. 2 is a planned view of a part of the apparatus of FIG. 1, taken along line 2—2 of FIG. 1.

Referring to the drawings in detail, an illustrative apparatus for carrying out the method of the present invention will be described. The apparatus shown in FIGS. 1 and 2 is one of many possible alternative arrangements for utilizing an ion beam of high velocity in bombarding a semiconductor material. Other apparatus useful for ion bombardment is shown in U.S. Patents 2,787,564 and 2,750,541, and more complex and versatile arrangements are known in the field of nuclear physics.

The specific arrangement shown in FIG. 1 is directed to the ion bombardment of a thin semiconductor body and comprises an ion propulsion tank 20 having a tungsten contact ionizer 22 and ion accelerator of standard design and operation at one end and a port 24 at the other end. Aperture 26 is provided for connection to a vacuum pump so that an appropriate vacuum may be maintained during the bombardment. The port 24 is closed with a semiconductor supporting closure plate 25 made of aluminum. The plate 25 is sealed to tank 20 by gasket 19 and includes a wafer supporting heating element 30, shield assembly 33 and electrical connector assemblies 18.

The plate 25 is provided with apertures 27, in which electrical connector assemblies 18 of standard design are sealed. The assemblies 18 have the outer ends 28 connected to a conventional voltage source (not shown) and the inner ends 29 connected to and supporting a tantalum strip heater element 30. The heater element supports a graphite plate 31 on which the sample semiconductor 32 is held. Mica or similar insulating retainers (not shown) may be utilized to hold the sample 32 and plate 31 in abutting relationship to adjacent heater element 30.

A shield assembly 33 is provided and consists of a molybdenum shield plate 34 supported on a pair of spaced legs 35. The plate 34 and legs 35 are attached to the interior of plate 25 by bolts 36. The plate 34 shields the electrical assemblies and central portion of plate 25 from the ion beam 37 and is provided with an aperture 38, as shown in FIG. 2.

The wafer 32 is supported by the graphite block 31 and heater element 30 so that the aperture 38 of the shield assembly 33 exposes a preselected portion of the wafer to the ion beam 37. The aperture 38 in the above apparatus was a ¼ x ¾ inch rectangle, but may be of any desired configuration. Ion deflection systems may be incorporated between the ion source 22 and wafer 32 for moving the ion beam to any desired location as is well-known in the art.

The semiconductor body to be bombarded, e.g., ½ x 1 x .004 inch, is preferably first lapped and etched to eliminate contaminants. It is then mounted on graphite plate 31, and the closure plate 25 is sealed to the tank 20 by bolts 39.

In all of the hereinafter described samples the specimen was oriented so that the ions would be driven in the <110> direction. In this manner advantage was taken of the channeling effect, i.e., ions travelling in certain directions within the crystal suffer only glancing collisions, and therefore greater penetration depths are possible. This effect also provides a deeply penetrating component or tail so that the concentration of the secondary conductivity-type-determining impurities will have a gentle gradient. While this effect has been utilized in the embodiments described herein, it is clear that a steep concentration gradient at the junction may be obtained by utilizing other crystal orientations which do not provide a pronounced channeling effect.

A vacuum, e.g., about $10^{-5}$ to about $10^{-9}$ Torr, is maintained in the chamber 40. The chamber 40 may be first gettered by introducing cesium and/or flushed with an inert gas. A reservoir 41 of cesium heated from about 180° to about 200° C. is connected through valve 42 to the tank 20. Cesium vapor is flowed through the chamber 40 for about one-half hour, thereby removing absorbed oxygen in the system.

The tungsten heater 30 is brought to a temperature of from about 300 to about 700° C., thereby heating the wafer 32. The heater 30 may be energized and the wafer heated to the appropriate temperature while flushing the system to minimize the time required for preparation. This temperature may be varied over wide limits depending upon the bombarding conditions and the semiconductor material utilized. In this respect it has been found that a boron-doped silicon specimen, if bombarded under the above conditions, but in an unheated condition, will result in an intrinsic silcon surface with no conductivity-type conversion. This is interpreted to mean that the defects, i.e., work damage resulting from the bombardment, actually outnumber the cesium ions introduced. Thus, the temperature maintained during the bombardment must be sufficient for the defects and damage to the semiconductor structure resulting from the bombardment to substantially repair themselves, but less than the temperature where either the primary or secondary impurities readily diffuse or migrate throughout the semiconductor. In boron-doped silicon, under the cesium-ion bombarding conditions outlined, this temperature is maintained between about 300 and about 700° C. and preferably about 500° C. in order to insure defect repair. However, in the case of sodium ion bombardment the preferred temperature is less than 500° C., i.e., about 450, since this ion is of smaller size and, therefore, its injection will not result in as much damage to the crystal lattice structure.

The ion source 22 is turned on and the ion accelerating voltage applied. The cesium ions are accelerated to high velocities by the accelerating voltage. Typically, accelerating potential of 5 kev. for 30 minutes will result in cesium ion penetration of up to 1000 A., while progressively higher accelerating voltages will result in progressively larger penetrated distances. Since the accelerating voltage determines the depth of penetration of the ions, varying depths may be achieved by varying the accelerating voltages of the order of 10–100 kev. Thus, by varying the accelerating potential the depth of penetration may be varied within a single sample or between samples. The bombardment time may vary from a few minutes to several hours and determines the concentration of the ions injected into the sample. In this manner, the thickness and donor concentration of the layer of altered conductivity-type may be controlled. The time used is sufficiently long to result in the conversion or alteration of the conductivity-type of a layer or portion on or in the wafer.

As an example of the method of the present invention, a boron-doped silicon specimen about 0.04 inch thick was tested and found to have an initial bulk resistivity of about 0.11 ohm-cm. p-type. This specimen had a boron dopant concentration of about $3\times10^{17}$ atoms/cc. and was exposed to the above-described apparatus under the conditions outlined. After bombardment at a temperature of about 400° C. for one hour with cesium ions at 10 kev. accelerating potentials, and with a beam intensity of about 1 $\mu$amp per sq. cm., the conductivity of the surface of the specimen exposed to the cesium ions was permanently altered to n-type. Upon cooling to room temperature after the above-described bombardment, the sample exhibited permanently altered electrical characteristics in the region of injected ion concentration. Under these ion acceleration conditions the thickness of the converted or altered volume was more than 500 A. A similar sample bombarded for 15 minutes at 10 kev. and then retained at a temperature of about 400° C. for an additional 2 hours showed no lack of definition resulting from diffusion or migration of the ions in the region of altered electrical characteristics.

The bombarding beam energy may be adjusted so that the ions will penetrate into the semiconductor any desired distance and may be localized in discrete volumes or layers for permanently altering or converting the conductivity characteristics of that volume or layer (see FIGS. 3*a* and *b*). Closely controlled penetration depth may be accomplished by utilizing monoenergetic ion beams and the thickness of the altered region or volume may be kept small, since the curve (see FIGS. 4*a* and *b*) of the concentration of the injected secondary impurity as a function of distance has a peak. After an altered volume of desired concentration and thickness has been generated in a semiconductor, no subsequent heat treatment of the semiconductor is required although such heat treatment may be utilized to promote diffusion and/or drift in the electric field of the junction in order to obtain a desired doping profile. Ions other than the secondary impurity ion may be separated out of the ion beam by techniques well-known in the art of mass spectroscopy.

Boron-doped silicon specimens were bombarded with cesium or sodium ions under the approximate standard conditions shown in the following table.

Table I

| | | |
|---|---|---|
| Beam energy | kev | 10 |
| Gas flushing time | min | 30 |
| Beam density | ($\mu$A./cm.$^2$) | 3 |
| Vacuum | Torr | $10^{-5}$ |
| Bombarding time | min | 30 |
| Direction of bombardment | | <110> |
| Temperature | ° C. | 500 |
| Bulk acceptor doping | atoms/cc. | $4\times10^{17}$ |

The physical and electrical characteristics of the samples were measured by standard techniques and the values of Table II exemplify these characteristics.

Table II

| | Cesium Ions | Sodium Ions |
|---|---|---|
| Breakdown Voltage (volts) | 13–14 | 17 |
| Field Effect Carrier Mobility (cm.$^2$/v. sec.) | 75–150 | 300–500 |
| Width of p-n junction (A.) (zero bias) | 800–1,200 | 1,700–2,500 |
| Sheet Conductivity ($\mu$mho/□) | 150–250 | 1,400–1,700 |

The controlled conversion of discrete regions of the specimens to n-type was observed with bulk acceptor doping in the range of from about $4\times10^{16}$ to about $4\times10^{19}$/cm.$^3$. Thus, samples with a wide range of bulk doping can be overdoped by the present invention, and donor concentrations at least as large as $4\times10^{19}$ can be routinely obtained. Variations in other bombardment conditions using cesium ions resulted in some changes in characteristics. For example, increasing the time of bombardment to two hours showed little effect on the electrical properties, while decreasing the bombardment time to six minutes resulted in erratic sheet conductivity values in a field effect structure. Thus, bombardment times of longer than a few minutes are desirable to establish a steady state under the standard conditions outlined above. Raising the specimen temperature during bombardment to 700° C. had a small effect (a factor of two decrease) while lowering this temperature to 300° C. resulted in a decrease in sheet conductivity of two or three orders of magnitude. Annealing for two hours at 500° C. subsequent to bombardment had essentially no effect, while a 45 hour anneal at that temperature resulted in a fourfold decrease in sheet conductivity. The effect of reducing cesium ion energy to 3 kev. was found to correspond to a factor of about five reduction in sheet conductivity and a factor of about two in donor concentration.

Sheet conductivity measurements for cesium-bombarded specimens had values ranging from about 200 to about 250 $\mu$mho/□ for a bulk doping of $4\times10^{16}$/cc. over a range of from 10.8 to 0 volts applied reverse bias. Similar measurements for sodium ion bombarded specimens showed a factor of eight increase in sheet conductivity for the same applied reverse bias and bulk doping. It is, therefore, apparent that the present invention is particularly useful in fabricating devices of the type generally known as field effect transistors where high sheet conductivities are desirable and precise control of the region of altered conductivity is necessary.

Measurements of the width of the depletion layer formed by the method of the present invention utilizing a bulk doping of $4\times10^{16}$/cm.$^3$, as indicated by standard capacitance techniques, showed widths ranging from about 800 A. to about 1200 A. for standard cesium bombarded specimens. Combined capacitance and field effect techniques showed carrier mobilities of the order of 100 cm.$^2$/v. sec. Similarly, sodium ion bombarded specimens showed junction widths ranging from 1700 A. to about 2500 A. with corresponding carrier mobilities in the 400 to 550 cm.$^2$/v. sec. range, or about a factor of five larger than in the cesium ion case. Thus, the present invention provides a method for controlling the depletion layer thickness. Such control is particularly useful in a wide range of device applications ranging from the large depletion distances utilized in nuclear particle detectors to the much smaller depletion layer thickness required in nonlinear capacitors. It is also apparent that the high carrier mobilities provided by the present invention are of particular significance in signal translating devices where high conductivity is desirable.

The depth of the junction is dependent upon the energy of the bombarding ions, the concentration of the injected ions as compared to the bulk doping, and upon the crystal orientation. In those cases where the temperature is relatively high or duration of the bombardment long, the depth of the junction will tend to increase and the junction grading will be more gentle. Silicon samples with a uniform boron acceptor concentration and bombarded under standard conditions, provided junctions sufficiently proximate the surface for use as solar cells. Such junctions were obtained utilizing both cesium and sodium as the injected ions. Measurements on these samples utilizing standard techniques showed a photo-generated current comparable with those of devices made by standard diffusion techniques with the sodium bombarded specimen providing substantially higher photo-generation currents.

At ambient temperatures the above described characteristics are not substantially affected by the diffusivity of the injected ions. Thus, the diffusivity of sodium ions in a specimen bombarded under standard conditions was estimated from capacitance measurements to be about 5 orders of magnitude less than lithium, while the diffusivity of cesium was estimated to be several orders of magnitude less than sodium. Thus, the secondary conductivity-type-determining impurities utilized in the present invention provide a p-n junction of controlled size (both in depth and width) and high definition.

While the silicon specimens described above utilized acceptor dopants uniformly distributed throughout the initial specimen, such acceptors may be restricted to a portion or portions of the specimen and a plurality of junctions formed. It is also within the contemplation of the present invention to utilize acceptor dopant concentration gradients in combination with secondary impurity gradients of either the same or opposite slopes. In this manner the width of the depleted region may be controlled not only by the gradient of donors injected in accordance with the present invention but also by the cooperative combination of the donor and acceptor gradients. Further, as noted above, the donor gradient may be made steeper by utilizing a crystal orientation which does not enhance ion penetration through a channeling effect.

The present invention may also be utilized to obtain finite junctions of any desired geometry either on the surface or within the semiconductive body. Any preselected pattern may be formed by using ion beam deflection, apertured masks, including oxide masking techniques or semiconductor movement or combinations of these skill-of-the-art techniques. Examples of various patterns which may be formed by the present invention are shown in U.S. Patents 3,064,167; 3,064,132; 3,063,879; 2,819,990; 2,787,564; 3,056,888; 2,588,254 and 2,709,232.

Since the cesium ion is the largest of the secondary conductivity-type-determining impurities while silicon is one of the smaller semiconductor hosts, it is clear that the injection of other secondary impurities into the other host semiconductor bodies may be accomplished in the same manner. The accelerating voltages utilized in the preferred embodiment described, however, are higher than would be required to obtain the same penetration depth of a smaller secondary conductivity-type-determining impurity, such as rubidium or sodium in silicon or such an impurity in larger host semiconductors such as germanium.

The concentrations obtained by the above described method have been measured by standard neutron activation analysis, and it has been found that the concentration of cesium is about .15 $\mu$gm./cm.$^2$, or substantially in excess of the maximum equilibrium solubility of cesium in the converted region and in excess of the boron concentration throughout the altered region. This is more apparent from FIGS. 4*a* and *b*, wherein the concentration of cesium with respect to the concentration of the boron dopant in the exposed semiconductor is shown. The diode characteristics of the cesium rich layer were established by the well-known guard ring technique utilizing phosphorus diffused into a ring-shaped area on the wafer. When the center of the ring which did not contain phosphorus was subjected to Cs ion bombardment as described above, the breakdown voltage was found to be reduced by about one-third as a result of the cesium concentration. In this manner, the injection of Cs into the boron-dope silicon specimen was found to alter the electrical characteristics of the bombarded surface. Thus, that portion of the semiconductor where the cesium concentration is in excess of the boron concentration exhibits n-type conductivity, while that portion where the boron dopant predominates exhibits the usual p-type conductivity associated with the primary conductivity-type-determining impurity boron. In portions of the body where the primary and secondary impurity concentrations are equal, an intrinsic region will be formed.

The grading of the donor as shown in FIG. 4 has been measured and found to have values of the order of $10^{22}$/cm.$^4$ for a bulk doping of $10^{17}$/cm.$^3$ with the cesium ion concentration gradient being the steepest. It is apparent from FIG. 4 that the slope as well as the width of the depleted region will depend upon the bulk acceptor dopant level. Thus, if the acceptor dopant value is reduced, the p-n junction will be formed at a lower point on the donor curve which has a lower gradient and consequently a larger resulting depletion region width. Further, reduction of the acceptor dopant concentration to the point where the p-n junction is formed on the tail portion of the donor curve will result in very large depletion region widths. Thus, precise control of these widths may be accomplished by the present invention.

The provision of electrical contacts to the various layers or regions of differing conductivity so that the altered semiconductor resulting from the described process may be utilized as a signal translating device may be made by well-known plating or other techniques.

It is clear that while the above examples have shown semiconductors of Group IV of the Periodic Table of Elements containing primary conductivity-type-determining impurities from Group III, that such semiconductors doped with Group V elements could also be bombarded. In this latter case, when bombarded with secondary impurities, volumes of higher concentration, i.e., n plus (n+) type conductivity, would be obtained. Further, initially intrinsic silicon can be converted to n-type by the above standard process by injecting ions in the intrinsic host until a concentration of secondary conductivity-type impurities is sufficient to provide a controlled conductivity area.

The above described preferred embodiments are illustrative of the general principles of the present invention and various modifications may be made by those skilled-in-the-art without departing from the scope of the invention. For example, the sequential bombardment with secondary impurity ions of different energies may be utilized to form p-n-p structures. Further, two or more secondary impurity ions may be utilized either sequentially or simultaneously to obtain one or more altered conductivity zones with a semiconductor body, or to control the concentration gradient of the secondary impurity in the region of the junction.

These and other applications of the described invention are within the scope of the present invention as defined in the following claims.

What is claimed is:

1. A method of permanently altering the electrical characteristics of at least one portion of a semiconductor body selected from the class consisting of silicon, germanium and alloys thereof, containing a preselected concentration of an acceptor comprising the steps of heating the body to a temperature of from about 300° C. to about 700° C. and bombarding said heated body with ions of at least one element selected from the class consisting of Na, K, Rb and Cs for a time and with an energy to form a volume in said body having a concentration of said at least one element sufficient to materially alter the conductivity charactistics of said volume.

2. The method of claim 1 wherein said secondary impurity is sodium.

3. The method of claim 1 wherein said secondary impurity is cesium.

4. The method of claim 1 wherein said body is silicon; said acceptor is boron; and said secondary impurity is cesium.

5. A method of controlling the electrical characteristics of a volume of a semiconductor body taken from the group consisting of germanium, silicon, alloys thereof, and semiconductor compounds of the Group III–V type which comprises heating the body to a temperature of from about 300° C. to about 700° C. to promote repair of damaged structure while bombarding the heated body with ions of at least one secondary conductivity type determining impurity, said secondary impurity being an interstitial type dopant having a low diffusivity within said semiconductor body, said body being bombarded with said impurity for a time and with an energy to form a volume in said body having electrical characteristics determined by the secondary impurity concentration of said volume.

6. The method of claim 5 wherein the ion is one secondary impurity and said bombardment is continued for a time and with an energy to provide a concentration of said impurity in said volume which is greater than the equilibrium solubility of said impurity in said semiconductor.

7. The method of claim 5 wherein said heated body is oriented in a preselected crystallographic direction with respect to said bombarding ions.

8. A method of controlling the electrical characteristics of a volume of a semiconductor body of a preselected conductivity type taken from the group consisting of germanium, silicon, alloys thereof, and semiconductor compounds of the Group III–V type which comprises heating the body to a temperature of from about 300° C. to about 700° C. while bombarding the heated body with ions of at least one secondary conductivity type determining impurity different from said preselected conductivity type, said secondary impurity being of an interstitial type dopant having a low diffusivity within said semiconductor body, said body being bombarded with said impurity for a time and with an energy to form a volume in said body having electrical characteristics determined by the secondary impurity concentration in said volume.

9. A method of permanently altering the electrical characteristics of a volume of a semiconductor body taken from the group consisting of germanium, silicon, alloys thereof, and semiconductor compounds of the Group III–V type, said body having p-type conductivity, comprising the steps of heating the body to a temperature or from about 300° C. to about 700° C., bombarding said heated body with ions of at least one secondary conductivity type determining impurity of the n-type, said secondary impurity being an interstitial type dopant having a low diffusivity within said body, maintaining said bombardment for a time and at an energy sufficient to provide a concentration of said secondary impurities in a portion of said body sufficient to alter the conductivity of said portion, and maintaining said temperature throughout said bombardment.

10. A method of permanently altering the electrical characteristics of at least a portion of a semiconductor body taken from the group consisting of germanium, silicon, alloys thereof, and semiconductor compounds of the Group III–V type, said body containing a concentration of at least one primary conductivity type determining impurity, comprising the steps of heating the body to a temperature of from about 300° C. to about 700° C. and bombarding at least a portion of said heated body with ions of at least one secondary conductivity type determining impurity of a conductivity different from said primary conductivity type, said secondary impurity being an intersitial type dopant having a low diffusivity within said body, said bombardment being continued for a time and at an energy sufficient to establish a concentration gradient of said secondary impurity in a discrete volume of said semiconductor to alter the electrical characteristics initially fixed by the concentration of said primary impurity.

11. The method of claim 10 wherein said bombardment is continued for a time and at an energy until the concentration of said secondary impurity in said discrete volume is greater than the concentration of said primary impurity.

12. A method of permanently altering the electrical characteristics of at least one portion of a semiconductor body taken from the group consisting of germanium, silicon, alloys thereof, and semiconductor compounds of the Group III–V type, said semiconductor containing a preselected concentration of a primary impurity, comprising the steps of heating the body to a temperature of from about 300° to about 700° C. and bombarding said heated body in a preselected crystallographic direction with ions of at least one element selected from the class consisting of Na, K, Rb and Cs for a time and with an energy to form a volume in said body which has electrical characteristics altered from those initially fixed by the concentration of primary impurity in said body.

13. The method of claim 12 wherein said semiconductor is silicon and said primary impurity is boron.

14. The method of claim 12 wherein said primary impurity is an acceptor and said volume has a concentration of said at least one element which is at least equal to the concentration of said primary impurity in said volume.

15. In a semiconductor device a body of semiconductor material taken from the group consisting of germanium, silicon, alloys thereof, and semiconductor compounds of the Group III–V type, at least one junction of controlled size and high definition in said body, one side of said junction having the electrical characteristics of said body, the other side of said junction having an integral volume containing a preselected concentration of a secondary impurity interstitial type dopant having a low diffusivity within said body, said volume of interstitial dopant having electrical characteristics different from said body.

16. The device of claim 15 wherein said intersitial dopant is selected from the class consisting of Na, K, Rb and Cs.

17. The device of claim 16 wherein said intersitial dopant has a concentration in said integral volume which is greater than its equilibrium concentration in said body.

18. The device of claim 15 wherein said secondary impurity is sodium.

19. The device of claim 15 wherein said secondary impurity is cesium.

20. The device of claim 15 wherein said body is a boron-doped silicon semiconductor and said secondary impurity is cesium.

References Cited by the Examiner

UNITED STATES PATENTS

| | | | |
|---|---|---|---|
| 2,750,541 | 6/1956 | Ohl | 148—1.5 |
| 2,787,564 | 4/1957 | Schockley | 148—1.5 |
| 3,132,408 | 5/1964 | Pell | 148—1.5 |

HYLAND BIZOT, *Primary Examiner.*